(12) United States Patent
Davenport

(10) Patent No.: US 7,957,709 B1
(45) Date of Patent: Jun. 7, 2011

(54) BETA CORRECTION BLOCK

(75) Inventor: William H. Davenport, Portland, OR (US)

(73) Assignee: Triquint Semiconductor, Inc., Hillsboro, OR (US)

( * ) Notice: Subject to any disclaimer, the term of this patent is extended or adjusted under 35 U.S.C. 154(b) by 732 days.

(21) Appl. No.: 12/043,026

(22) Filed: Mar. 5, 2008

(51) Int. Cl.
*H04B 1/04* (2006.01)
*H04B 1/38* (2006.01)

(52) U.S. Cl. .................... 455/127.1; 455/343.1; 455/574

(58) Field of Classification Search ............... 455/127.1, 455/127.5, 572, 574, 343.1, 334; 323/313, 323/315, 281, 288; 327/540, 541, 538, 546
See application file for complete search history.

(56) References Cited

U.S. PATENT DOCUMENTS

| | | | | |
|---|---|---|---|---|
| 4,914,542 A * | 4/1990 | Wagoner | ......................... | 361/98 |
| 4,920,309 A * | 4/1990 | Szepesi | ......................... | 323/269 |
| 4,972,136 A * | 11/1990 | Banura | ......................... | 323/275 |
| 5,164,679 A | 11/1992 | Dittmer | | |
| 5,343,141 A * | 8/1994 | Metro et al. | ................... | 323/288 |
| 5,570,060 A * | 10/1996 | Edwards | ......................... | 327/541 |
| 5,955,915 A * | 9/1999 | Edwards | ......................... | 327/541 |
| 6,392,392 B1* | 5/2002 | Nakahara | ....................... | 323/312 |
| 6,819,185 B1 | 11/2004 | Jensen | | |
| 6,850,119 B2 | 2/2005 | Arnott | | |
| 6,930,555 B2 | 8/2005 | Bachhuber et al. | | |
| 6,950,636 B2 | 9/2005 | Rozenblit et al. | | |
| 7,064,614 B2 | 6/2006 | Feng et al. | | |
| 7,173,491 B2* | 2/2007 | Bocock et al. | ................. | 330/285 |
| 7,193,474 B2* | 3/2007 | Phillips et al. | ................. | 330/298 |
| 7,839,218 B2* | 11/2010 | Shimamoto et al. | .......... | 330/298 |
| 7,873,335 B2* | 1/2011 | Hug et al. | ................... | 455/127.1 |
| 2008/0042752 A1 | 2/2008 | Salove et al. | | |

* cited by examiner

*Primary Examiner* — Sonny Trinh

(74) *Attorney, Agent, or Firm* — Schwabe Williamson & Wyatt

(57) ABSTRACT

Embodiments of apparatuses, methods, and systems for a radio frequency (RF) amplifier with a beta correction block are generally described herein. In some embodiments, the beta correction block may be configured relative to an output stage so that a variation in a beta of the output stage is tracked by a corresponding variation of a reference provided by the beta correction block. Other embodiments may be described and claimed.

22 Claims, 5 Drawing Sheets

BETA CORRECTION BLOCK

FIELD

Embodiments of the present invention relate generally to the field of circuits, and more particularly to a beta correction block.

BACKGROUND

Radio frequency (RF) power amplifiers are often used in portable battery-operated wireless devices, such as cellular telephones. Extending battery life is a concern for users and manufacturers of these battery-operated wireless devices. One of the factors in determining the battery life in such devices is the power consumption of the RF power amplifiers. The RF power amplifiers are designed to operate into a target load impedance and are typically coupled with an antenna of the battery-operated wireless device.

However, under an antenna mismatch condition, e.g., when the antenna approaches another object (e.g., metal structures, human contact, or the like), the load impedance of the RF power amplifier changes, and the RF power amplifier draws excess current. In some cases, the current can exceed two times the current drawn under a target load impedance. When the RF power amplifier draws excess current, the battery life of the battery-operated wireless device is reduced. In addition, the adjacent channel power ratio (ACPR) and error vector magnitude (EVM) limits are often exceeded when the RF power amplifier draws excess current.

Current-limiting circuits have been designed to limit the current draw of an RF power amplifier under an antenna mismatch condition. These current-limiting circuits rely upon a current-sensing circuit to determine the instantaneous current draw of an RF power amplifier. However, present current-sensing circuits suffer from accuracy problems due to their components having characteristics that vary with process and temperature. This variation may reduce current-sensing accuracy by as much as thirty percent.

BRIEF DESCRIPTION OF THE DRAWINGS

Embodiments of the invention are illustrated by way of example and not by way of limitation in the figures of the accompanying drawings, in which like references indicate similar elements and in which.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present invention; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "A/B" and "A and/or B" mean (A), (B), or (A and B); and the phrase "A, B, and/or C" means (A), (B), (C), (A and B), (A and C), (B and C) or (A, B and C).

As used herein, "coupled with" may mean either one or both of the following: a direct coupling or connection, where there is no other element coupled or connected between the elements that are said to be coupled with each other; or an indirect coupling or connection, where one or more other elements coupled or connected between the elements that are said to be coupled with each other.

Various blocks may be introduced and described in terms of an operation provided by the blocks. These blocks may include various hardware, software, and/or firmware elements in order to provide the described operations. While some of these blocks may be shown with a level of specificity, e.g., providing discrete elements in a set arrangement, other embodiments may employ various modifications of elements/arrangements in order to provide the associated operations within the constraints/objectives of a particular embodiment.

For purposes of clarity, various elements may be referred to by using descriptors identifying blocks to which the elements belong. Other than designating a particular block, these descriptors do not add any additional limitations to the elements. For example, a beta correction resistor is a resistor that exists in the beta correction block. The "beta correction" descriptor implies no other functional or structural restrictions.

Figure 1:
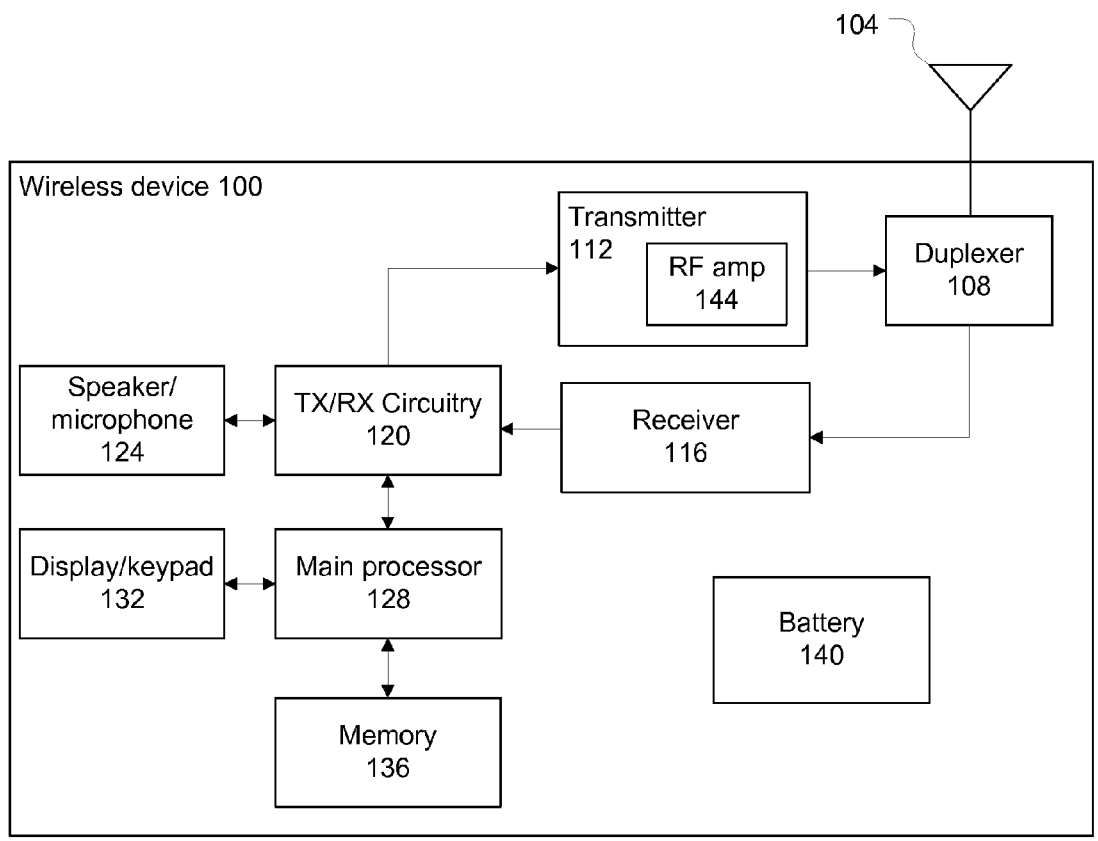
FIG. 1 illustrates a wireless device in accordance with various embodiments of the present invention.

FIG. 1 illustrates a wireless device 100 in accordance with various embodiments. The wireless device 100 may have an antenna structure 104, a duplexer 108, a transmitter 112, a receiver 116, transmit/receive (TX/RX) circuitry 120, a speaker/microphone 124, a main processor 128, a display/keypad 132, a memory 136, and a battery 140 coupled with each other as shown.

In various embodiments, the wireless device 100 may be any wireless communication device including, but not limited to, a mobile telephone, a paging device, a personal digital assistant, a text-messaging device, a portable computer, or any other device capable of wireless communication.

In various embodiments, the wireless communication may be in accordance with any of a number of cellular communication protocols, e.g., a global system for mobile communications (GSM), universal mobile telecommunication system (UMTS), code division multiple access (CDMA), etc. In other embodiments, the wireless communication may be additionally/alternatively in accordance with computer network communication protocols, e.g., Worldwide Interoperability for Microwave Access (WiMax), High Performance Radio Metropolitan Area Network (HIPERMAN), etc.

The main processor 128 may execute a basic operating system program stored in the memory 136, in order to control the overall operation of the wireless device 100. For example, the main processor 128 may control the reception of signals and the transmission of signals by TX/RX circuitry 120, receiver 116, and transmitter 112. The main processor 128 may be capable of executing other processes and programs resident in the memory 136 and may move data into or out of memory 136, as desired by an executing process.

The TX/RX circuitry 120 may receive analog or digital voice data from the microphone or other outgoing data (e.g., web data, e-mail, etc.) from the main processor 128. The TX/RX circuitry 120 may transmit an RF signal to the transmitter 112. The transmitter 112 may include an RF power amplifier 144 (hereinafter also referred to as "RF amplifier 144") to amplify the RF signal for transmission. The amplified RF signal may be forwarded to the duplexer 108 and then to the antenna structure 104 for an over-the-air (OTA) transmission to an intended recipient.

In a similar manner, the TX/RX circuitry 120 may receive an incoming OTA signal from the antenna structure 104 through the duplexer 108 and receiver 116. The incoming signal may be from a communication system or a wireless network provider. The TX/RX circuitry 120 may process and send the incoming signal to the speaker (e.g., for voice data) or to the main processor 128 (e.g., for web browsing data) for further processing.

In various embodiments, the antenna structure 104 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

The main processor 128 may also be coupled with the display/keypad 132. A user of the wireless device 100 may use the keypad to enter data into the wireless device 100. The display may be a liquid crystal display capable of rendering text and/or graphics. Alternate embodiments may use other types of displays. The battery 140 may be coupled with the electrical components of the wireless device 100 in accordance with known electrical principles.

Those skilled in the art will recognize that the wireless device 100 is given by way of example and that for simplicity and clarity, only so much of the construction and operation of the wireless device 100 as is necessary for an understanding of the embodiments of the present invention is shown and described. In addition, or as an alternative, although an exemplary wireless device 100 is shown and described, embodiments of the present invention contemplate any suitable component or combination of components performing any suitable tasks in association with wireless device 100, according to particular needs. Moreover, it is understood that the wireless device 100 should not be construed to limit the types of devices in which embodiments of the present invention may be implemented.

In accordance with various embodiments of the present invention, the RF amplifier 144 provides, in addition to said amplification of the RF signal, for sensing and limiting the current drawn under an antenna mismatch condition, as described below in greater detail with respect to FIGS. 2-4.

Figure 2:
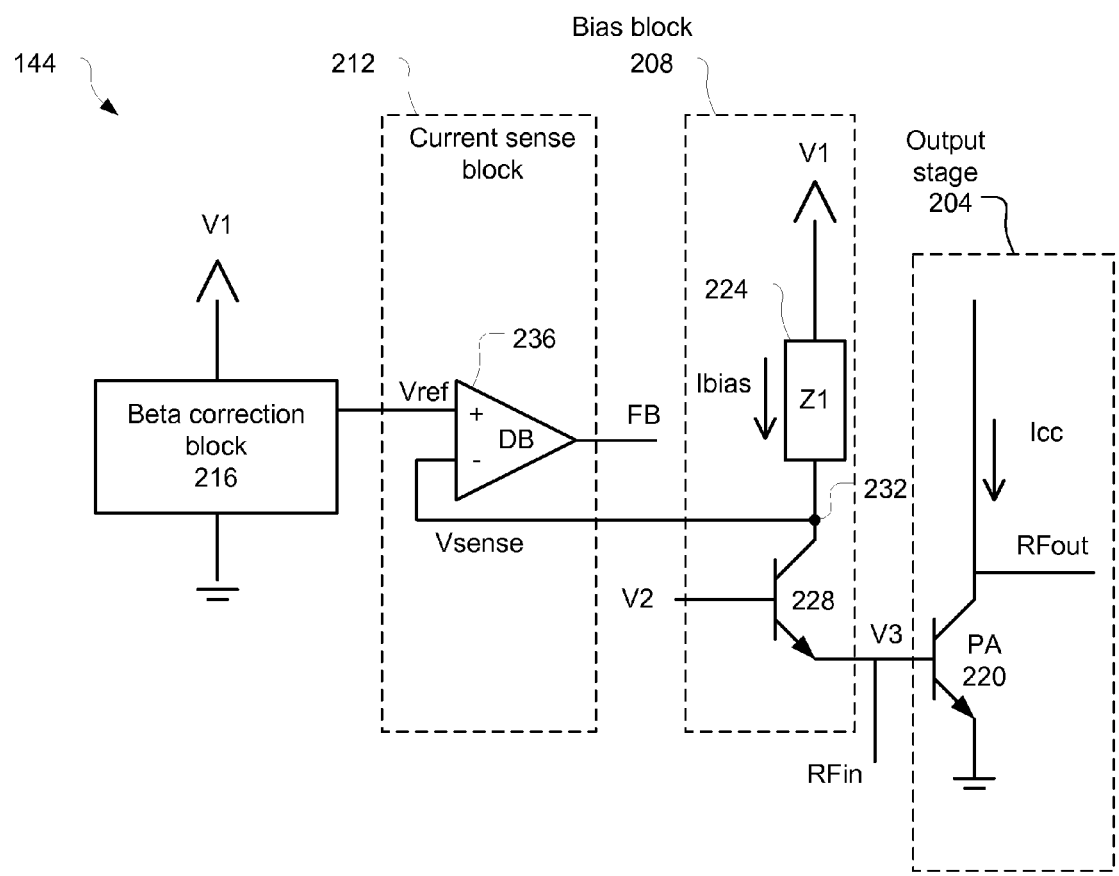
FIG. 2 illustrates an RF power amplifier of the wireless device in accordance with various embodiments of the present invention.

FIG. 2 illustrates the RF amplifier 144 in accordance with various embodiments of the present invention. The RF amplifier 144 may include a source regulated voltage V1, an output stage 204, a bias block 208, a current sense block 212, and a beta correction block 216 coupled with each other as shown.

The RF amplifier 144 may be formed on a gallium arsenide (GaAs) substrate. However, other semiconductor materials (e.g., silicon, indium phosphide, etc.) may be used. In addition, some embodiments are described in terms of bipolar junction transistor (BJT) technology (e.g., heterojunction bipolar transistors (HBTs)). However, embodiments of the invention may be practiced using field effect transistor (FET) technology (e.g., metal-semiconductor field effect transistors (MESFETs) and pseudomorphic high electron mobility transistors (pHEMTs)).

The output stage 204 may include a power amplifier (PA) transistor 220. The output stage 204 may have a current flowing into a collector of the PA transistor 220. This current may hereinafter also be referred to as "collector current Icc." For simplicity and clarity, the output stage 204 is shown with only a single transistor; however, in various embodiments, the output stage 204 may include other circuit elements such as one or more additional transistors, resistors, etc.

An RF input signal RFin may be provided to a base of the PA transistor 220, with an RF output signal RFout provided at the collector of the PA transistor 220.

The bias block 208 may be coupled with the output stage 204 to apply a bias voltage V3 to the output stage 204. In particular, the PA transistor 220 may be biased by the bias block 208 coupled with the base of the PA transistor 220, which may be an emitter-follower transistor. The coupling of the bias block 208 with the output stage 204 may occur through a bias transistor 228 of the bias block 208. Specifically, in accordance with an embodiment, an emitter of the bias transistor 228 may be coupled with the base of the PA transistor 220.

The bias block 208 may have an amplifier bias voltage V2 at a gate of the bias transistor 228. The amplifier bias voltage V2 may be used to control operation of the output stage 204.

The bias block 208 may also have a bias resistor 224 that provides an impedance Z1 to a bias current Ibias. The bias current Ibias may be related to the collector current Icc by a factor of beta given by the following equation:

$$Icc = Ibias * beta, \quad \text{Equation 1}$$

where beta is the amplification factor of the PA transistor 220.

Additionally, for any collector current Icc, a voltage Vsense at node 232 may be known if the voltage V1 is known and well regulated. The voltage Vsense may be determined by the following equation:

$$Vsense = V1 - Ibias * Z1. \quad \text{Equation 2}$$

The output stage 204, which may be a final amplification stage of transmitter 112, may, in certain situations, experience an output load mismatch condition of the antenna structure 104 that causes the collector current Icc to increase. To prevent an excessive increase in the collector current Icc, the current sense block 212 may have a decision block 236 coupled with the bias block 208 to determine whether the collector current Icc exceeds a threshold current. This determination may be based at least in part on the bias current Ibias. Specifically, in accordance with some embodiments, the decision block 236 may determine whether the voltage Vsense, which is related to Icc through equations 1 and 2, is less than Vref, which is related to a reference threshold current as will be explained below.

In various embodiments, the decision block 236 may be a logic circuit including one or more circuit elements to provide the operation described above. These circuit elements may include, but are not limited to, a differential amplifier, a comparator, etc.

A determination that Vsense is less than Vref may correspond to a determination that the collector current Icc exceeds the threshold current. Upon such a determination, the decision block 236 may generate a corresponding feedback signal (FB) that may be used to limit the collector current Icc. In some embodiments, a current-limit block (not shown) may receive the feedback signal and limit the collector current Icc by controlling, e.g., V1, V2, and/or V3.

Measuring the bias current Ibias rather than the collector current Icc directly may be more efficient, as a direct measurement of Icc may result in undesired power loss. However, the relationship between the collector current Icc and bias current Ibias and, therefore, the accuracy of the current sensing, is dependent on a variation of the beta of the PA transistor 220, as shown by Equation 1. Accordingly, the beta correction block 216 may be configured relative to the output stage 204 so that a variation in a beta of the output stage 204 is tracked by a corresponding variation in a reference provided by the beta correction block 216, e.g., the reference voltage Vref. FIGS. 3 and 4 depict some of the configurations that the beta correction block 216 may employ in accordance with various embodiments.

Figure 3:
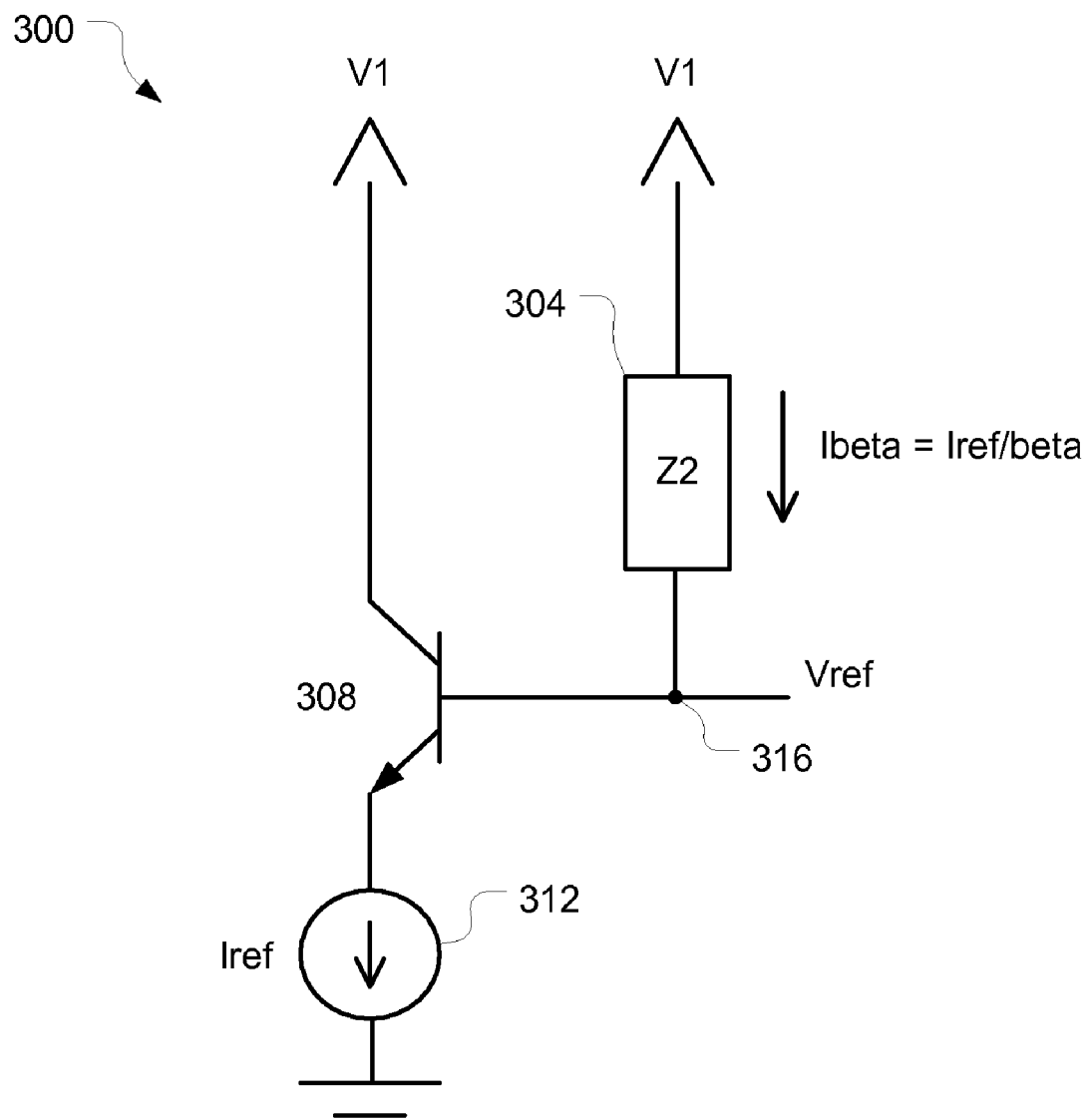
FIG. 3 illustrates a beta correction block that may be used in an RF power amplifier in accordance with various embodiments of the present invention.

FIG. 3 illustrates a beta correction block 300 in accordance with various embodiments of the present invention. The beta correction block 300 may be used interchangeably with beta correction block 216 in the RF amplifier 144. The beta correction block 300 may have two paths coupled with the source regulated voltage V1. The first path may include a beta correction resistor 304 having an impedance Z2. The second path may include a beta correction transistor 308 and a current source 312 coupled with each other and with the beta correction resistor 304 as shown.

The components of the beta correction block 300, with the possible exception of the current source 312, may reside on the same die and, therefore, use the same process and layout techniques as the remaining components of the RF amplifier 144. This may allow the characteristics of the respective components to track each other with process and temperature variation. For example, transistors on the same die may all have at least similar, e.g., similar or the same, betas. Therefore, the beta of transistors 308 and 220 may vary in the same direction and to a similar degree due to variations in die processing and/or operating temperatures.

The current source 312 may provide a reference current Iref that is proportional to a desired threshold current for the collector current Icc. For example, in an embodiment, a desired threshold current may be 1 ampere (amp), while the reference current Iref may be 1 milliamp, or less or more. The current source 312 may be coupled with an emitter of the beta correction transistor 308 and with ground.

A beta current Ibeta may flow into a base of the beta correction transistor 308. The beta current Ibeta may be related to the reference current Iref by a function of the beta of the beta correction transistor 308, which, as discussed above, is at least similar to the beta of the PA transistor 220, as shown in the following equation:

$$Ibeta=Iref/beta. \qquad \text{Equation 3}$$

The beta current Ibeta flowing through the beta correction resistor 304 may generate the reference voltage Vref at a reference node 316. For large values of beta, the beta current Ibeta flowing through the beta correction resistor 304 may be quite small. Iref may be chosen such that Ibeta is a manageable value.

The value of the impedance Z2 may be selected to be proportional to the value of the impedance Z1. In some embodiments, the impedance Z2 may be very large in proportion to Z1. For example, Z2 may be equal to Z1 multiplied by a scale factor, e.g., Icc/Iref. The desired threshold current level may then be set by adjusting the reference current Iref according to the following equation:

$$Iref/beta*Z2=Icc/beta*Z1, \qquad \text{Equation 4}$$

where the betas cancel and the collector current Icc is the desired threshold current level.

In an embodiment having a desired threshold current of 1 amp, the proportion of Z1 to Z2 may be 1000 to 1, and the reference current may be 1 milliamp. Thus, the sensed voltage Vsense will be equal to reference voltage Vref when the collector current Icc equals 1 amp. In a similar manner, the reference voltage Vref, and corresponding desired threshold current, may be set to any desired value of a particular embodiment.

In such a manner, the beta correction block 300 may provide a reference voltage Vref that reduces the uncertainty of the current-sensing operation introduced by beta variability due to, for example, process and temperature variations.

As alluded to earlier, in some embodiments the current source 312 may exist on a die distinct from a die having the remainder of the RF amplifier 144. The die having the current source 312 may be a complementary metal oxide semiconductor (CMOS) integrated circuit. In some embodiments, a controller, e.g., the TX/RX circuitry 120, may control the current source 312 to adjust the Iref value based on the operating mode of the wireless device 100.

For example, in a first operating mode using a first modulation scheme, e.g., a guassian minimum shift keying (GMSK) scheme, a first threshold current level, e.g., 2 amps, may be desired. The current source 312 may be controlled to supply an Iref at a corresponding level, e.g., 2 milliamps. The wireless device 100 may then switch into a second operating mode using a second modulation scheme, e.g., an eight phase phase-shift keying (8PSK) scheme. In this mode, a second threshold current level, e.g., 1.2 amps, may be desired. Therefore, the current source 312 may be adjustably controlled to supply the Iref at a corresponding level, e.g., 1.2 milliamps.

Figure 4:
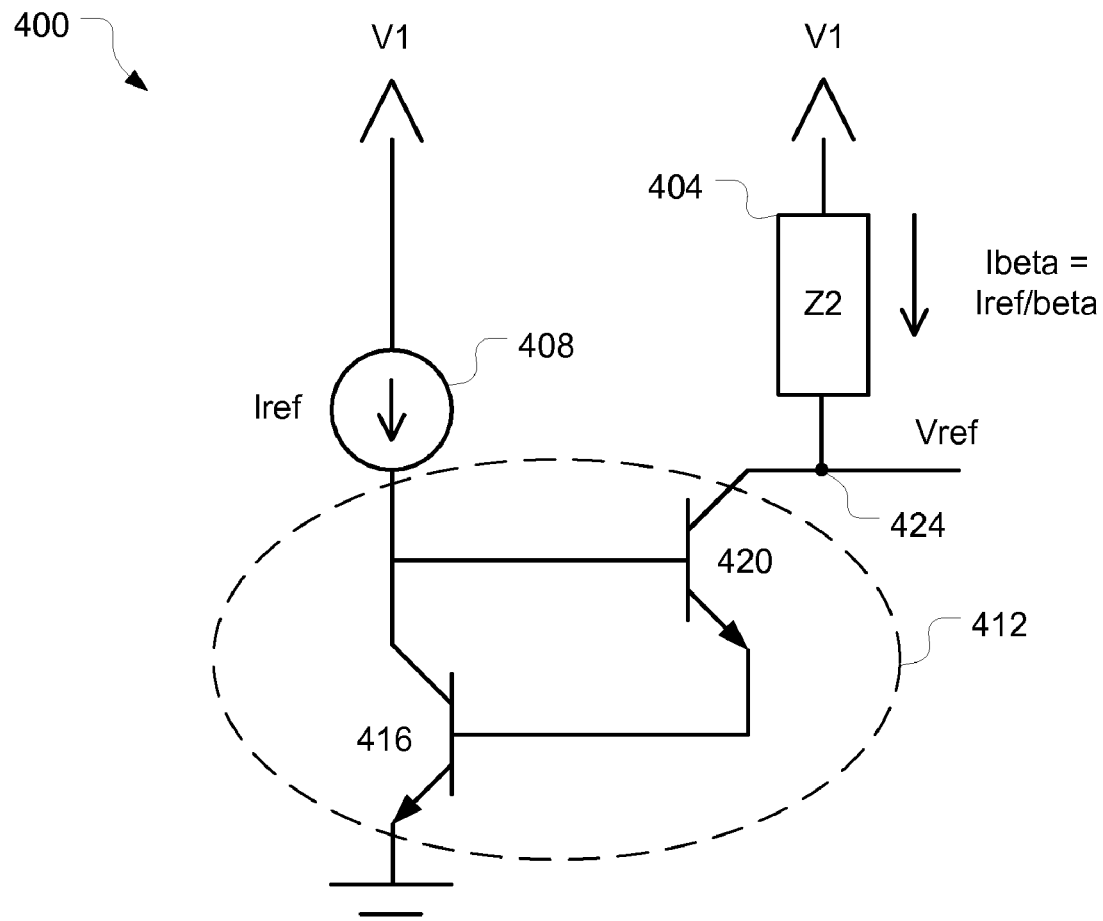
FIG. 4 illustrates another beta correction block that may be used in an RF power amplifier in accordance with various embodiments of the present invention.

FIG. 4 illustrates a beta correction block 400 in accordance with various embodiments of the present invention. The beta correction block 400 may be used interchangeably with beta correction block 216 in the RF amplifier 144. Furthermore, the beta correction block 400 may have components similar to like-named components of the beta correction block 300 with the differences noted herein.

Similar to beta correction block 300, the beta correction block 400 may have two paths coupled with the source regulated voltage V1. The first path may include a beta correction resistor 404 having an impedance Z2. The second path may include a current source 408. The resistor 404 and the current source 408 may be coupled with a current mirror 412 having a first transistor 416 and a second transistor 420 coupled with each other and earlier components as shown.

The operation of the beta correction block 400 is similar to the above-described operation of the beta correction block 300; however, in this embodiment, the current source 408 may push the reference current Iref into a collector of transistor 416 and/or a base of transistor 420, rather than pulling current out of a transistor's emitter. The beta corrected reference voltage Vref at node 424 may be controlled by selection of an appropriate impedance Z2 and Iref as discussed above.

In some embodiments, the layout of the beta correction block 400 may be compatible with a positive (p)-type semiconductor process, while the beta correction block 300 may be compatible with a negative (n)-type semiconductor process.

Figure 5:
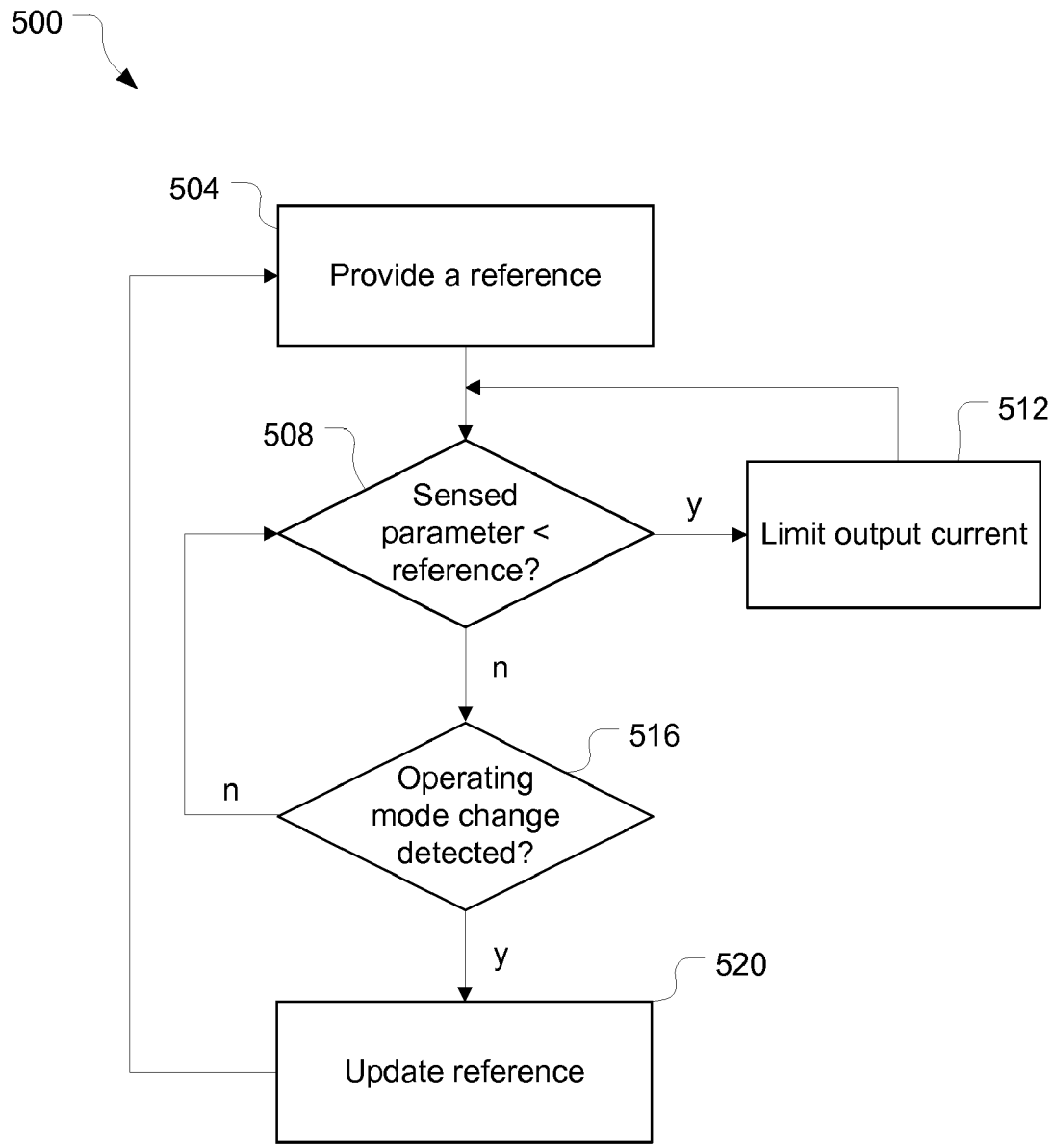
FIG. 5 is a flowchart of a current-sensing and limiting operation of the wireless device in accordance with various embodiments of the present invention.

FIG. 5 illustrates a beta corrected current-sensing and limiting operation 500 of the wireless device 100 in accordance with various embodiments of the present invention. At 504, a reference, e.g., a reference voltage Vref, is provided to a current sense block. For example, a beta correction block may provide the reference to the current sense block.

At 508, the current sense block and, in particular, a decision block of the current sense block, may determine whether a sensed parameter, e.g., a sensed voltage Vsense, is less than the reference. This condition, as described above, may be indicative of an output stage's collector current exceeding a particular threshold current. However, in other embodiments, other conditions may be detected to determine such an event.

If the decision block determines that the sensed parameter is less than the reference, the decision block may limit the collector current at 512, e.g., the decision block may generate a feedback signal that may be used as a control to limit the collector current.

If the decision block determines that the sensed parameter is greater than or equal to the reference, the beta correction block may determine whether an operating mode change, e.g., a change from a GMSK scheme to an 8PSK scheme, has been detected at 516. If no operating mode change is detected, the decision block may continue to monitor the sensed parameter with the established reference at 508.

If an operating mode change is detected, e.g., by a controller of the wireless device 100 changing the reference current Iref, the beta correction block may update the reference at 520, thereby providing a reference at 504. The decision block may then determine whether the sensed parameter is less than the updated reference at 508, which may be a condition indicative of the collector current exceeding a threshold current corresponding to the updated reference.

Although the present invention has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present invention. Those with skill in the art will readily appreciate that the present invention may be implemented in a very wide variety of embodiments. This description is intended to be regarded as illustrative instead of restrictive on embodiments of the present invention.

What is claimed is:

1. A circuit comprising:
an output stage to amplify a radio frequency (RF) signal;
a current sense block coupled with the output stage to determine whether a collector current of the output stage exceeds a threshold current; and
a beta correction block coupled with the current sense block, to provide a reference to the current sense block to facilitate the determination of whether the collector current exceeds the threshold current, the beta correction block is configured relative to the output stage so that a variation in a beta of the output stage is tracked by a corresponding variation of the reference.

2. The circuit of claim 1, wherein the variation in the beta and corresponding variation of the reference are based at least in part on temperature variation and/or process variation.

3. The circuit of claim 1, further comprising:
a bias block coupled with the output stage to apply a bias voltage to the output stage, the bias block having a bias current related to the collector current; and
the current sense block is coupled with the bias block and configured to determine, based at least in part on the bias current, whether the collector current exceeds the threshold current.

4. The circuit of claim 3, wherein the bias block has a bias resistor to provide an impedance to the bias current, and the beta correction block comprises:
a current source to provide a reference current that is proportional to the threshold current; and
a beta correction resistor to provide an impedance to a beta current of the beta correction block, wherein the impedance provided by the beta correction resistor is proportional to the impedance provided by the bias resistor.

5. The circuit of claim 4, wherein the beta correction block further comprises a transistor coupled with the current source and the beta correction resistor and having a beta that is at least similar to the beta of the output stage.

6. The circuit of claim 5, wherein the transistor includes an emitter coupled with the current source.

7. The circuit of claim 6, wherein the transistor includes a base coupled with the beta correction resistor.

8. The circuit of claim 7, wherein the reference comprises a reference voltage at the base of the transistor.

9. The circuit of claim 4, wherein the beta correction block further comprises:
a first transistor coupled with the current source and the beta correction resistor and having a beta that is at least similar to the beta of the output stage; and
a current mirror having the first transistor and a second transistor and coupled with the current source and the beta correction resistor.

10. The circuit of claim 9, wherein the first transistor includes a collector coupled with the current source and a base coupled with an emitter of the second transistor, and the second transistor further includes a base coupled with the current source and a collector coupled with the beta correction resistor.

11. A method comprising:
providing a reference to track a variation in a beta of an output stage of a radio frequency (RF) amplifier so that a variation in the beta of the output stage is tracked by a corresponding variation in the reference; and
determining, based at least in part on the reference, whether a collector current of the output stage exceeds a threshold current.

12. The method of claim 11, further comprising:
applying a bias voltage to the output stage; and
determining, based at least further in part on a bias current related to the collector current, whether the collector current of the output stage exceeds the threshold current.

13. The method of claim 11, wherein said providing of the reference includes providing a reference current that is proportional to the threshold current.

14. The method of claim 13, wherein the reference comprises a first reference and the threshold current comprises a first threshold current, further comprising:
providing a second reference; and
determining, based at least in part on the second reference, whether the collector current of the output stage exceeds a second threshold current.

15. The method of claim 14, wherein said providing of the second reference includes:

providing a second reference current that is proportional to the second threshold current.

16. An apparatus comprising:
- a transmitter including a radio frequency (RF) amplifier including
  - an output stage to amplify an RF signal;
  - a current sense block coupled with the output stage to determine whether a collector current of the output stage exceeds a threshold current; and
  - a beta correction block coupled with the current sense block to provide a reference to the current sense block to facilitate the determination of whether the collector current exceeds the threshold current, the beta correction block is configured relative to the output stage so that a variation in a beta of the output stage is tracked by a corresponding variation of the reference; and
- an omnidirectional antenna coupled with the transmitter and configured to facilitate an over-the-air (OTA) transmission of the amplified RF signal.

17. The apparatus of claim 16, wherein the RF amplifier further comprises:
- a bias block coupled with the output stage to apply a bias voltage to the output stage, the bias block having a bias current related to the collector current; and
- the current sense block coupled with the bias block and configured to determine, based at least in part on the bias current, whether the collector current exceeds the threshold current.

18. The apparatus of claim 17, wherein the bias block has a bias resistor to provide an impedance to the bias current, and the beta correction block comprises:
- a current source to provide a reference current that is proportional to the threshold current; and
- a beta correction resistor to provide an impedance to a beta current of the beta correction block, wherein the impedance provided by the beta correction resistor is proportional to the impedance provided by the bias resistor.

19. The apparatus of claim 18, wherein the beta correction block further comprises a transistor coupled with the current source and the beta correction resistor and having a beta that is at least similar to the beta of the output stage.

20. The apparatus of claim 19, wherein the transistor includes an emitter coupled with the current source.

21. The apparatus of claim 18, wherein the beta correction block further comprises:
- a first transistor coupled with the current source and the beta correction resistor and having a beta that is at least similar to the beta of the output stage; and
- a current mirror having the first transistor and a second transistor and coupled with the current source and the beta correction resistor.

22. The apparatus of claim 21, wherein the first transistor includes a collector coupled with the current source and a base coupled with an emitter of the second transistor, and the second transistor further includes a base coupled with the current source and a collector coupled with the beta correction resistor.

* * * * *